United States Patent [19]

Sharpe-Geisler

[11] Patent Number: 5,905,385
[45] Date of Patent: May 18, 1999

[54] MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)

[75] Inventor: Bradley A. Sharpe-Geisler, San Jose, Calif.

[73] Assignee: Advanced Micro Devices, Inc., Sunnyvale, Calif.

[21] Appl. No.: 08/828,520

[22] Filed: Apr. 1, 1997

[51] Int. Cl.$^6$ ............................................. H03K 19/177
[52] U.S. Cl. ............................................. 326/39; 326/41
[58] Field of Search ............................................. 326/37–41

[56] References Cited

U.S. PATENT DOCUMENTS

| | | | |
|---|---|---|---|
| 5,260,881 | 11/1993 | Agrawal et al. | 364/489 |
| 5,386,156 | 1/1995 | Britton et al. | 326/37 |
| 5,488,316 | 1/1996 | Freeman et al. | 326/41 |
| 5,550,782 | 8/1996 | Cliff et al. | 326/40 |
| 5,559,450 | 9/1996 | Ngai et al. | 326/40 |
| 5,815,003 | 9/1998 | Pedersen | 326/39 |
| 5,815,726 | 9/1998 | Cliff | 326/39 |

OTHER PUBLICATIONS

"The Programmable Logic Data Book", *Xilinx*, pp. 2–9 through 2–24, 1994, No Month.

*Primary Examiner*—Jon Santamauro
*Assistant Examiner*—Don Phu Le
*Attorney, Agent, or Firm*—Fliesler, Dubb, Meyer & Lovejoy

[57] ABSTRACT

A field programmable gate array (FPGA) with pass gates included in configurable logic block (CLB) circuitry to enable look up tables (LUT) inputs to be selectively tied together when a larger LUT is desired, or simply if it is desirable for particular LUT inputs to be identical. Since LUT inputs may be tied together, circuitry is also included to more effectively utilize configuration block multiplexers (CBLOCK MUXs) no longer needed to provide LUT inputs. In one embodiment, with LUT inputs tied together to form a larger LUT, circuitry is provided so that the select input of a MUX in the larger LUT is provided from one of the CBLOCK MUXs which is freed up. In another embodiment, the gates of pass gates connecting LUT inputs together, as well as the gates of other pass gate used for configuring other circuitry in the LUTs may be controlled from a single memory cell.

8 Claims, 5 Drawing Sheets

MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)

BACKGROUND OF THE INVENTION

1. Field of the Invention

The present invention relates to field programmable gate arrays (FPGAs). More particularly, the present invention relates to the configuration of resources connected to look up tables in an FPGA to enable greater configurability of the FPGA to meet user needs.

2. Description of the Related Art

FIG. 1 shows a block diagram illustrating components of a typical FPGA. As shown, the typical FPGA includes input/output (I/O) buffers, an array of configurable logic blocks (CLBs), switch matrix blocks (SBLOCKs) and configuration blocks (CBLOCKs).

The I/O buffers are arranged around the perimeter of the device and provide an interface between internal components of the FPGA and external package pins. Routing resource lines interconnect the I/O buffers, SBLOCKs, and CBLOCKs. The CBLOCKS include multiplexers to selectively provide signals from the routing resources to the CLBs.

As shown in FIG. 2, each CLB includes a series of look up tables (LUTs). The CLB of FIG. 2 in particular includes multiple three input LUTs, with two three input LUTs on each side of the CLB. Inputs to the LUTs are provided from a CBLOCK as shown. Outputs of the LUTs (not shown) may be selectively connected back to routing resources of the FPGA.

FIG. 3 illustrates the components typically utilized in a three input LUT as shown in FIG. 2. The three input LUT of FIG. 3 includes a 3 input decoder and 8 memory cells. The three input decoder decodes a signal provided to the LUT inputs to enable one of the 8 memory cells. The 8 memory cells have outputs connected to form a single LUT output. The memory cells can be programmed in any arbitrary manner to provide a desired LUT output based on inputs to the LUT. The table beneath the LUT illustrated in FIG. 3 illustrates programming of the memory cells of the LUT to provide a three input AND gate where only all "1" inputs to the LUT generate a "1" output.

FIG. 4 shows circuitry included in a CBLOCK section of FIG. 1 as connected to a 3 input LUT. As shown, the CBLOCK section includes multiple 8 to 1 MUXs, each receiving 8 inputs which are connectable to routing resources. Each of the MUXs of the CLB provide an output to the input of a LUT. Three programmable select bits are provided to each MUX in the CBLOCK to selectively provide one of the 8 inputs at its output.

Although only eight routing resources are shown in FIG. 1 providing possible connections to a single CBLOCK, up to 40 or more of the routing resources are typically provided along a path for connection to a single CBLOCK. The eight inputs of each MUX of the CBLOCK are then arbitrarily connectable to selected ones of the 40 or more routing resources.

FIG. 5 shows components of a 4 input LUT which may be included in a CLB, the 4 input LUT being composed of two 3 input LUTs 501 and 502, as shown in FIG. 2, along with a multiplexer (MUX) 503. As shown, the outputs of the 3 input LUTs 501 and 502 are connected to inputs of the MUX 503. A fourth input of the 4 input LUT provides a select signal to the MUX. The output of the MUX then provides the output of the 4 input LUT. The inputs of the 3 input LUT 501 are provided from the outputs of MUXs $511_{0-2}$ of a CBLOCK, while the inputs of the 3 input LUT 502 are provided by the outputs of MUXs $512_{0-2}$. With a 4 input LUT, the inputs of the 3 input LUT 501 will need to be identical to the input of 3 input LUT 502. Thus, the MUX $511_0$ must provide the same output as MUX $512_0$. Similarly, MUX $511_1$ must provide the same output as MUX $512_1$, and MUX $511_2$ must provide the same output as MUX $512_2$.

Similar to creation of a 4 input LUT from two 3 input LUTs in FIG. 3, two 4 input LUTs may be combined to form a 5 input LUT and will include four 3 input LUTs. With the CLB of FIG. 2 it can be seen that to obtain four 3 input LUTs, LUTs from two sides of the CLB must be utilized. To provide the same input signals to a 3 input LUT on one side of a CLB as are provided to a 3 input LUT on another side, which will be required to create a 4 input LUT, routing resources will need to be connected through an SBLOCK to the other side of the CLB to provide identical signals to MUXs connected on two sides of the CLB. Such an approach is undesirable, however, because routing resources are utilized which might be utilized for other purposes.

SUMMARY OF THE INVENTION

The present invention includes circuitry enabling LUTs on different sides of a CLB to be selectively coupled together without requiring that routing resources be utilized to connect LUT inputs from one side of the CLB to another.

The present invention includes pass gates in a CLB of a FPGA enabling LUT inputs to be selectively connected together. The inputs of LUTs may be connected together when a larger LUT is desired, or even if a larger LUT is not desired when it is still desired that particular LUTs have identical inputs. Since LUT inputs may be tied together, circuitry is additionally included to disconnect MUXs in the CBLOCKs so that those MUXs may be utilized for other purposes. Since some CBLOCK MUXs may remain unutilized, additional routing resources are available to MUXs which are being utilized so that the MUXs which are utilized may be made larger to select from more possible inputs.

In one embodiment with LUT inputs tied together when a larger LUT is desired, circuitry is provided so that the select input of the MUX in the larger LUT is provided from one of the CBLOCK MUXs which is freed up for use when LUT inputs are tied together.

In another embodiment, the gates of pass gates connecting LUT inputs together to form a larger LUT are controlled from a single memory cell. The single memory cell can also serve to disconnect unused CBLOCK MUX outputs from LUT inputs and to connect the output of those MUXs for use in other manners, such as to provide a select input to the MUX of the larger LUT.

BRIEF DESCRIPTION OF THE DRAWINGS

Further details of the present invention are explained with the help of the attached drawings in which:

FIG. 5 shows components of a 4 input LUT which may provided from two 3 input LUTs shown in FIG. 2;

DETAILED DESCRIPTION

Figure 1:
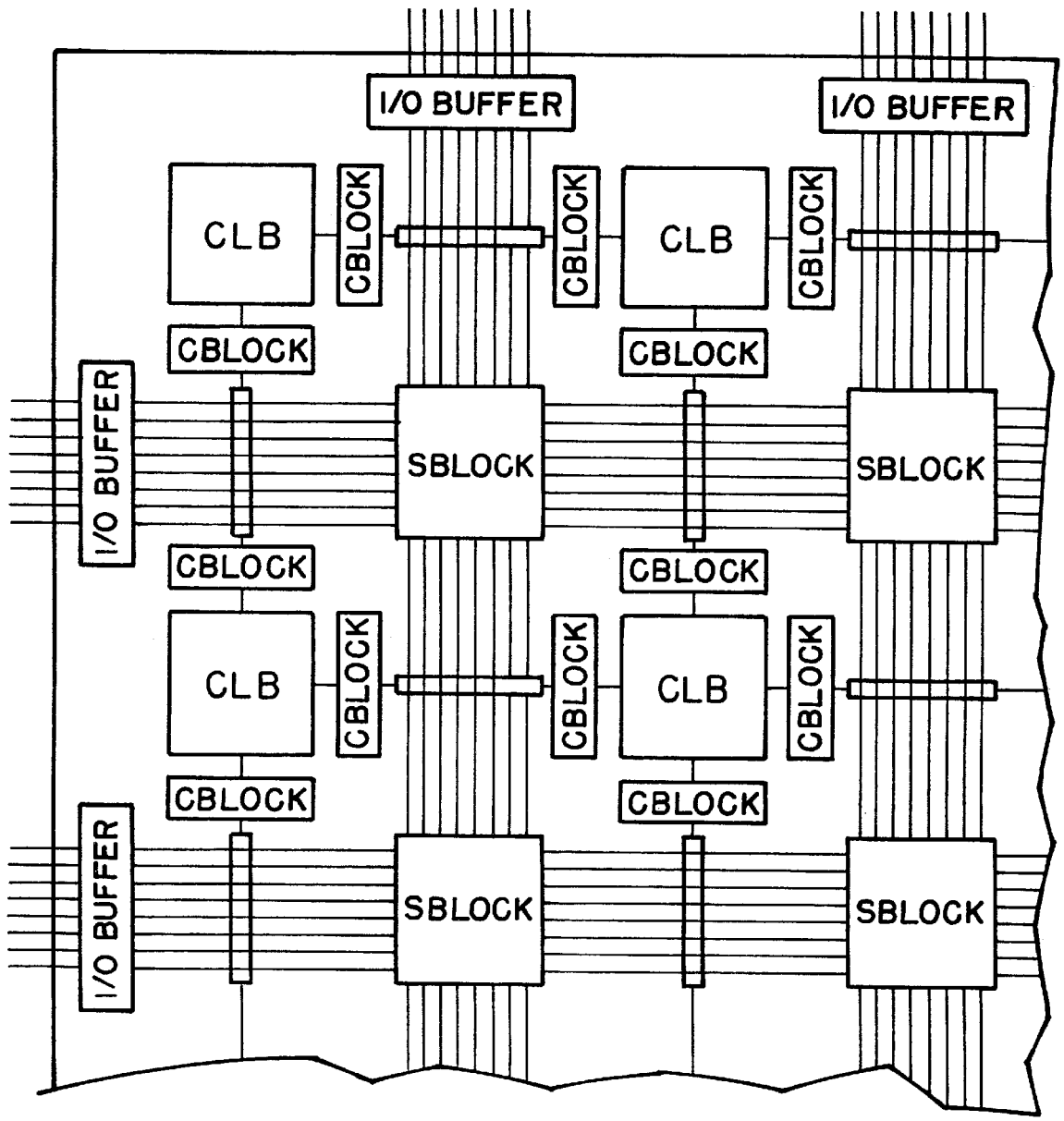
FIG. 1 shows a block diagram illustrating components of a typical FPGA.
Figure 2:
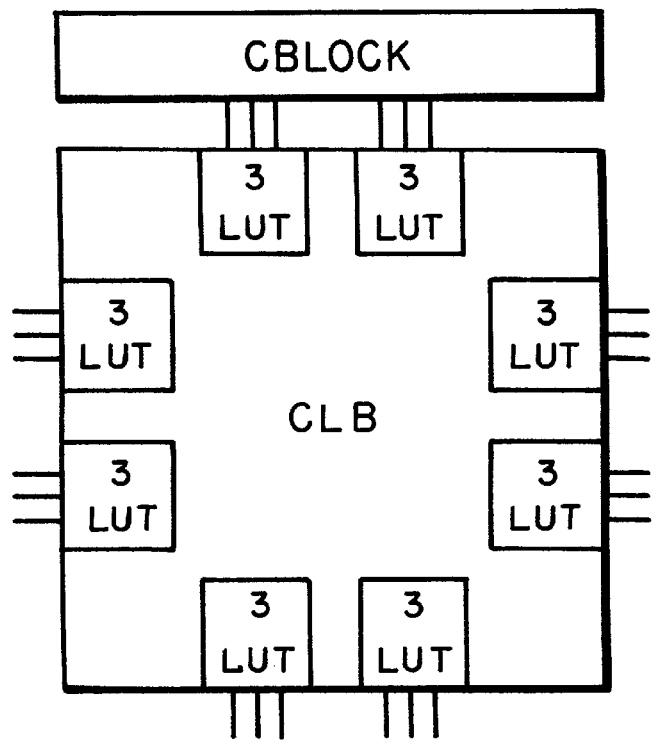
FIG. 2 illustrates a configuration of three input look up tables (LUTs) in a CLB of FIG. 1 and connection of a CBLOCK to the LUTS.
Figure 3:
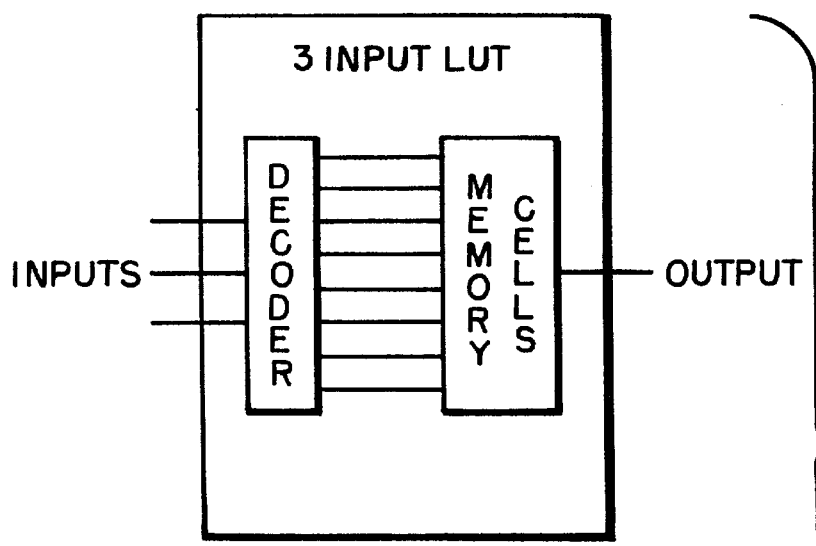
FIG. 3 illustrates components typically utilized in a three input LUT of FIG. 2.
Figure 4:
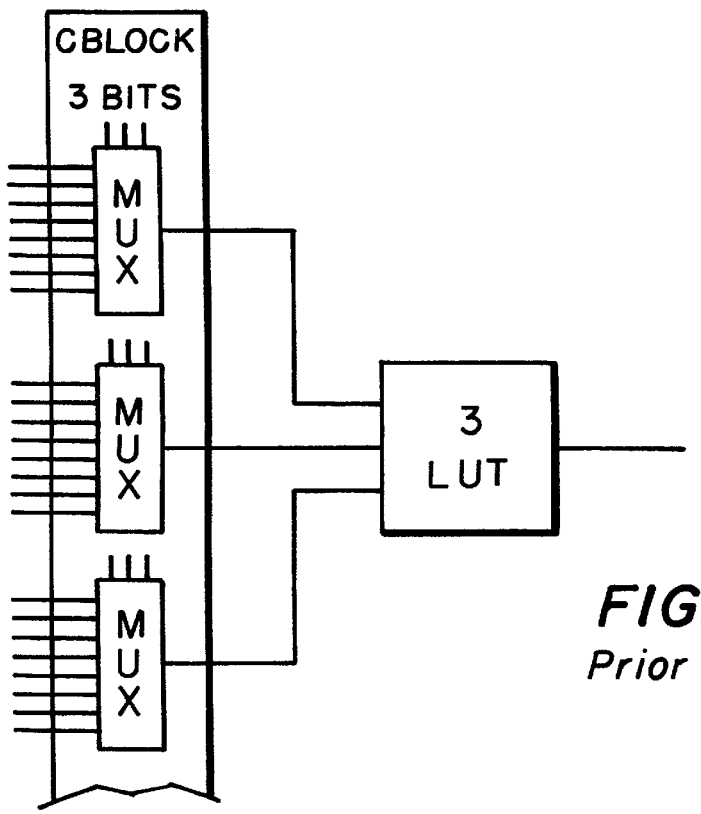
FIG. 4 shows circuitry included in a CBLOCK section of FIG. 1.
Figure 5:
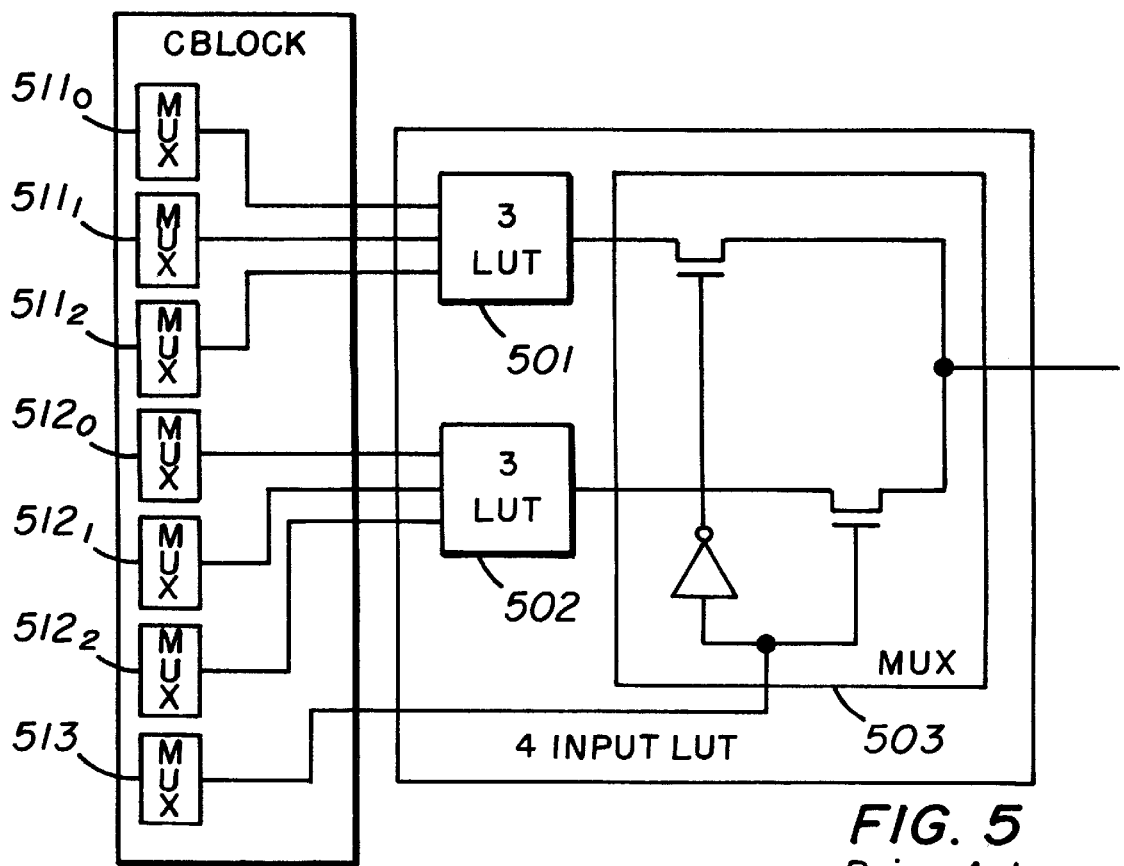
FIG. 5 shows circuitry included in a CBLOCK section of FIG. 1.
Figure 6:
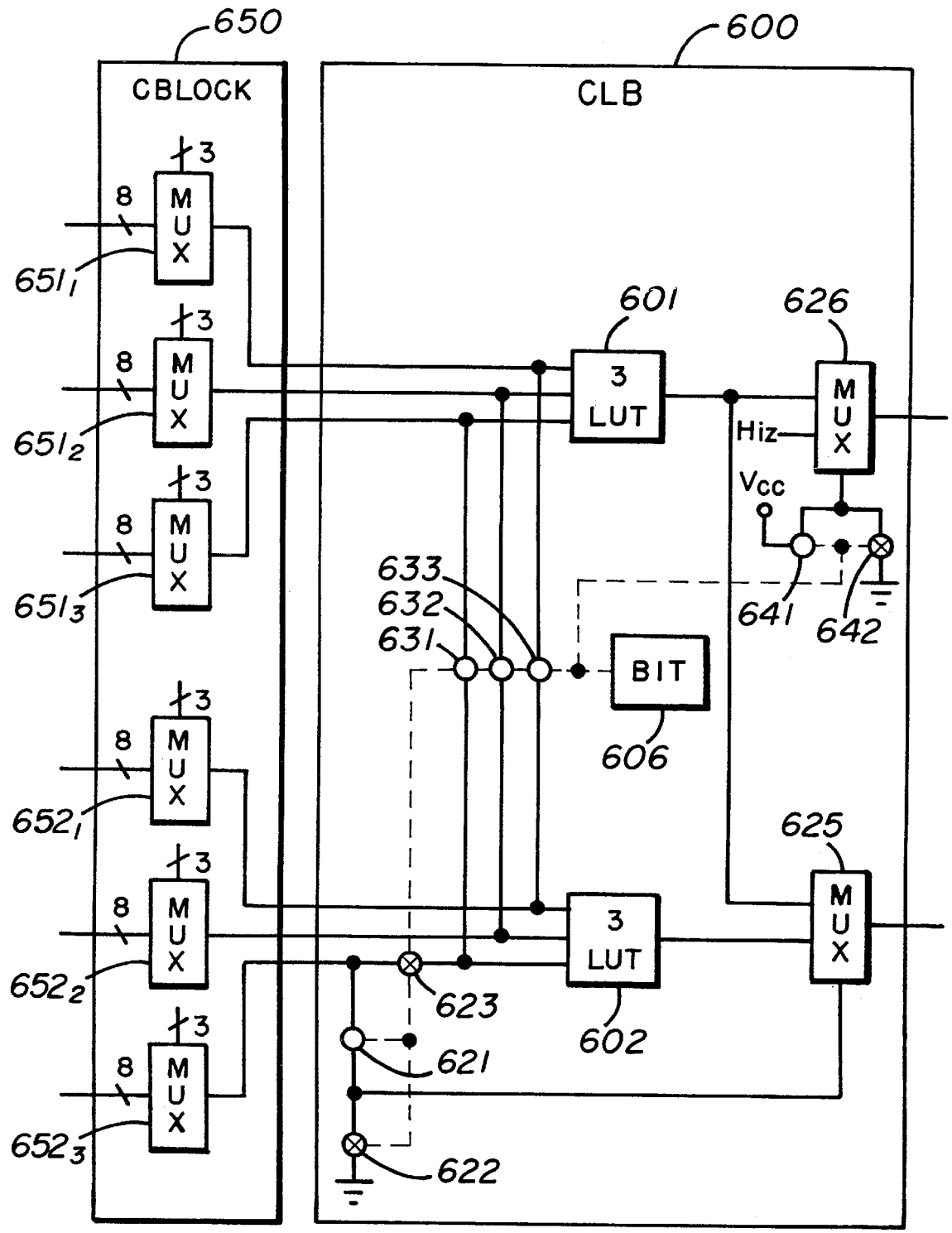
FIG. 6 shows components of the present invention used to selectively provide two 3 input LUTs or a 4 input LUT.

FIG. 6 shows components of the present invention utilized in a CLB 600 which has inputs provided from a CBLOCK 650. The portion of the CLB 600 shown includes two 3 input LUTs 601 and 602 with pass gates 631–633 of the present invention having source to drain paths connecting the inputs of the LUTs 601 and 602. The inputs of the 3 input LUTs 601 and 602 can be combined to enable forming a 4 input look up table, or to simply enable the LUT inputs to be identical if so desired.

The gates of pass gates 631–633 are shown controlled from a single memory cell bit 606. However, a separate bit can be utilized to control the gate of each pass gate 631–633.

With pass gates 631–633 tying the inputs of LUTs 601 and 602 together, only the output of CBLOCK MUXs $651_{1-3}$ will be needed to supply the inputs to LUTs 601 and 602, and the output of the remaining CBLOCK MUXs $652_{1-3}$ will no longer be needed to provide inputs to LUT 602. Because the inputs of each of the CBLOCK MUXs $651_{1-3}$ and $652_{1-3}$ are typically each provided from 8 different routing resource lines, 24 routing resource lines can be freed up when MUX $652_{1-3}$ are not utilized to provide inputs to LUT 602. Therefore, MUXs $651_{1-3}$ can each be made larger to utilize double the number of input bits, or 16 bits instead of the 8 bits shown.

With MUXs $652_{1-3}$ not needed to provide LUT inputs, the outputs of MUXs $652_{1-3}$ can be disabled, or configured for use for other purposes. To disable unneeded CBLOCK MUXs, those MUXs may be configured to respond to a no-connect or disable signal. The disable signal is provided as one of the signal states to the select lines of the MUX. Because one of the select signal states to the MUX is no longer available when a no-connect state is recognized, the MUX will be able to select from one less input. For instance, the 8 input MUXs shown in FIG. 6 will only be able to select from 7 inputs using the 3 bit select signal shown. With a single bit 606 controlling connection of pass gates 631–633, the no-connect signal state, if desired, can also be provided with appropriate connections to the single bit 606.

Alternatively to disconnect unused MUXs $652_{1-3}$ from the input of LUT 602 and to enable the unused MUXs to be used for other purposes, according to the present invention, additional pass gates can be provided connecting the MUX outputs to the LUT inputs, the pass gates being controlled to disconnect the MUX output from the LUT input when the MUX is not being utilized. An example of such a pass gate is pass gate 623 which connects the output of MUX $652_3$ to an input of LUT 602.

Further, in accordance with the present invention, with a pass gate such as pass gate 623 utilized, additional pass gates are also included, such as pass gates 621 and 622, to enable a disconnected MUX to be reconnected for use for another purpose. For example, the pass gates 621–623 together enable use of MUX $652_3$ to alternatively provide inputs to LUT 602, or to provide a select input to MUX 625.

MUX 625 is utilized along with MUX 626 to enable the outputs of LUTs 601 and 602 to be selectively provided from a single output when a 4 input LUT is desired, or to alternatively provide the outputs of LUTs 601 and 602 individually when 3 input LUTs are desired. The MUX 625 has inputs connected to the outputs of LUTs 601 and 602. The select input of MUX 625 when connected to a first voltage state, such as ground or a low voltage, selects the output of LUT 602 as its output. When the select input of MUX 625 is connected to a second voltage state, such as Vcc or a high voltage, it will provide the output of LUT 601 as its output. Similarly, MUX 626 will provide the output of LUT 601 at its output when its select signal is in the first state, and it will provide a high impedance signal when its select signal is in the second state.

Thus, in operation when it is desired that LUTs 601 and 602 operate as 3 input LUTs to provide separate outputs, a signal in the first state is provided to the select input of MUX 625 so that MUX 625 provides the output of 3 input LUT 602 only. Similarly the output of LUT 601 is provided as an output of MUX 626 when MUX 626 receives a similar low select signal in a first state. When it is desired that a 4 input LUT be formed, the select signal to MUX 625 must be provided from a fourth input to the LUT, with the fourth input in a first state selecting the output of LUT 602 at its output, and with the fourth input in a second state selecting the output of LUT 601 at its output. The MUX 626 will similarly receive a select signal in a second state to provide a high impedance as its output since the single output of LUT 601 is no longer desired.

Pass gates 621–623 enable a select input of the MUX 625 to be provided as the fourth LUT input from the unused CBLOCK MUX $652_3$ when a 4 input LUT is desired. Pass gates 621–623 also enable freeing MUX $652_3$ for use to provide the fourth LUT input when the inputs of LUTs 601 and 602 are connected together by pass gates 633–631. Pass gate 623 has a source to drain path connecting the output of MUX 652 to an input of LUT 602. Pass gate 621 has a source to drain path connecting the output of MUX $652_3$ to the select input of MUX 625. Pass gate 622 has a source to drain path connecting the select input of MUX 625 to ground. The gate of pass gate 621 is controlled to turn on pass gate 621 when pass gates 631–633 turn on, while the gates of pass gates 622 and 623 are controlled to turn off pass gates 622 and 623 when pass gates 631–633 turn on.

Pass gates 641 and 642 control the select input of the MUX 626 so that the output of LUT 601 can be provided at the MUX 626 output when 3 input LUTs are desired, and otherwise when a 4 input LUT is desired to provide a high impedance at its output. Pass gate 641 has a source to drain path connecting the output of MUX 641 to Vcc, while pass gate 642 has a source to drain path connecting the select input of MUX 625 to ground.

The gates of each pass gate 631–633, 621–623 and 641–642 may be all controlled by a single by 606 as shown, but may also be controlled by separate bits. The signal from bit 606 is shown provided on dashed lines to the gates of pass gates. The symbol ○ indicates a pass gate making a connection from its source to drain when the BIT signal is in a first state, such as high, and not making a connection when the BIT signal is in a second state, such as low. The symbol ⊗ indicates a pass gate not making a connection from its source to drain when the BIT signal is in the first state and making a connection when the BIT signal is in the second state.

Assuming that pass gates 631–633, 621–623 and 641–642 are controlled by the single bit 606 with the first state being high and the second state being low, operation is described below.

First, to provide the outputs of the 3 input LUTs as outputs of the CLB, the BIT 606 signal will be set to low. With the BIT 606 signal low, inputs of the LUTs 601 and 602 will not be connected together by pass gates 631–633. Further, pass gate 642 will connect the select input of MUX 626 to ground and pass gate 641 will be disabled so that the output of LUT 601 will be provided as the output of MUX 626. Further, the select input of MUX 625 will be disconnected from MUX 652$_3$ by pass gate 621 and tied to ground by pass gate 622 so to so that the output of LUT 602 will be provided as the output of MUX 625. Finally, the output of MUX 652$_3$ will be provided by pass gate 623 as an input to LUT 602.

Further, to provide a 4 input LUT, the BIT 606 signal will be set to high. With the BIT 606 signal high, inputs of the LUTs 601 and 602 will be connected together by pass gates 631–633. Thus, only the CBLOCK MUXs 651$_{1-3}$ providing inputs to the LUTs 601 and 602 will be needed to provide LUT inputs, freeing up the CBLOCK MUXs 652$_{1-3}$. Further, with the BIT signal high, pass gate 641 will provide the select signal to MUX 626 and pass gate 642 will be disabled so that the output of MUX 626 is in a high impedance state. Further, the select input of MUX 625 will be connected to the output of MUX 652$_3$ by pass gate 621 and pass gate 622 will disconnect the select input of MUX 625 from ground. Finally, the output of MUX 652 will disconnected from the input to LUT 602 by pass gate 623.

Note that alternatively, separate bits may be utilized to control the gates of one or more of the pass gates 631–633, 621–623 and 641–642. In this manner, one or more of the inputs of LUTs 601 and 602 can be connected together by pass gates 631–633 without MUXs 624 and 625 being connected to form a 4 input LUT.

Figure 7:
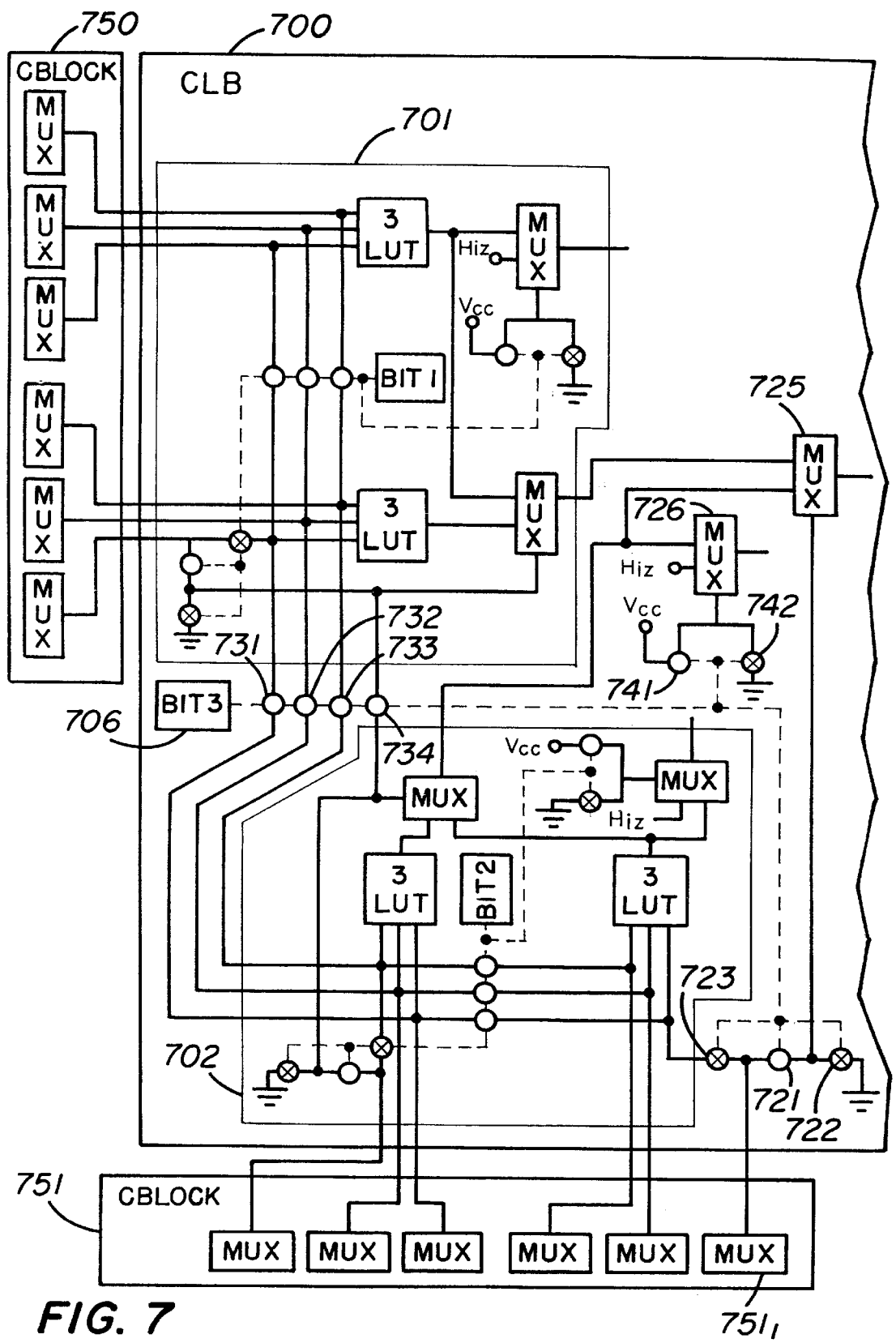
FIG. 7 shows components of the present invention used to selectively provide four 3 input LUTS, two 4 input LUTs or a 5 input LUT.

FIG. 7 shows components of the present invention utilized in a CLB 700 illustrating how the inputs of LUTs on two sides of a CLB can be tied together using pass gates. The circuit of FIG. 7 further illustrates how additional pass gates of the present invention can enable more effective use of routing resources when selectively provide four 3 input LUTs, two 4 input LUTS, or a 5 input LUT.

The CLB circuit 700 of FIG. 7 includes two circuits 701 and 702 with components configured as shown in FIG. 6. The circuits 701 and 702 enable connecting the inputs of two 3 input LUTs to free up MUXs and routing resources, as described above. Further, each of the circuits 701 and 702 can selective provide two 3 input LUTs each, or be configured to each provide a 4 input LUTs, as described above. Further, as described above, the pass gates of circuits 701 and 702 may each be controlled by a single memory cell, such as respective memory cells BIT1 or BIT2, or they may be controlled by individual memory cells.

Because when the inputs of circuits 701 and 702 are connected to form a 5 input LUT, their inputs will be identical, additional pass gates 731–734 are provided with source to drain paths connecting the inputs of circuit 701 to corresponding inputs of circuit 702. With pass gates 731–734 connecting the LUT inputs of circuits 701 and 702, the MUXs of one of CBLOCKs 750 or 751 can be made available for other purposes. Further, identical signals do not have to be provided by routing resources to MUXs of CBLOCK 750 as well as MUXs of CBLOCK 751 to two sides of CLB 700, which would be an inefficient use of routing resources.

As with pass gates in the circuits 701 and 702, pass gates 731–733 may be controlled by a single memory cell 706. However, a separate bit can also be utilized to control the gate of each pass gate 731–734 to enable individual connection of LUT inputs as a user desires.

With pass gates 731–733 tying the inputs of circuits 701 and 702 together, to enable MUXs which are no longer needed to supply LUT inputs to be used for other purposes, additional pass gates 721–723 are provided. Pass gates 721–723 enable use of MUX 751$_1$ to alternatively provide inputs to circuit 702, or to provide a select input to MUX 725.

MUX 725 is utilized along with MUX 726 to enable outputs of circuits 701 and 702 to be provided as a single CLB output when a 5 input LUT is desired, or to alternatively provide the outputs of LUTs individually when 4 or 3 input LUTs are desired. The MUX 725 has inputs connected to the outputs of circuits 701 and 702. The select input of MUX 725 when receiving a signal in the first state selects the output of circuit 702 as its output. When the select input of MUX 725 is receives the second voltage state, it will provide the output of circuit 701 as its output. Similarly, MUX 726 will provide the output of circuit 701 at its output when its select signal is in the first state, and it will provide a high impedance signal when its select signal is in the second state.

Pass gates 721–723 enable the select input of the MUX 725 to be provided as a fifth LUT input from the unused MUX 751$_1$ when a 5 input LUT is desired. Pass gates 721–723 also enable freeing MUX 751$_1$ for use to provide the fifth LUT input when the inputs of circuits 701 and 702 are connected together by pass gates 731–734. Pass gate 723 has a source to drain path connecting the output of MUX 752 to an input of circuit 702. Pass gate 721 has a source to drain path connecting the output of MUX 7511 to the select input of MUX 725. Pass gate 722 has a source to drain path connecting the select input of MUX 725 to ground. The gate of pass gate 721 is controlled to turn on pass gate 721 when pass gates 731–734 turn on, while the gates of pass gates 722 and 723 are controlled to turn off pass gates 722 and 723 when the pass gates 731–733 turn on.

Pass gates 741 and 742 control the select input of the MUX 726 so that the output of circuit 701 can be provided as the MUX 726 output when 4 input LUTs are desired, and otherwise when a 5 input LUT is desired to provide a high impedance at its output. Pass gate 741 has a source to drain path connecting the output of MUX 741 to Vcc, while pass gate 742 has a source to drain path connecting the select input of MUX 725 to ground.

The gates of each pass gate 731–734, 721–723 and 741–742 may be all controlled by a single bit 706 as shown, but may also be controlled by separate bits. The signal from bit 706 is shown provided on dashed lines to the gates of pass gates. As in FIG. 6, the symbol ○ indicates a pass gate making a connection from its source to drain when the bit 706 provides a signal in a first state, while the symbol indicates a pass gate making a connection from its source to drain when the bit 706 provides a signal in the second state.

Assuming that pass gates 731–734, 721–723 ad 741–742 are controlled by the single bit 706 with the first state being high and the second state being low, operation is described below.

First, to provide the outputs of 3 or 4 input LUTs as outputs of the CLB, the BIT 706 signal will be set to low. With the BIT3 signal low, inputs of the circuits 701 and 702 will not be connected together by pass gates 731–734. Further, pass gate 742 will connect the select input of MUX 726 to ground and pass gate 741 will be disabled so that the output of circuit 701 will be provided as the output of MUX 726. Further, the select input of MUX 725 will be disconnected from MUX 751$_1$ by pass gate 721 and tied to ground by pass gate 722 so that the output of circuit 702 will be provided as the output of MUX 725. Finally, the output of MUX 751₁ will be provided by pass gate 723 as an input to circuit 702.

Further, to provide a 5 input LUT, the bit 706 signal will be set to high. With the BIT 706 signal high, inputs of the circuits 701 and 702 will be connected together by pass gates 731–733. Thus, only a portion of the MUXs from one of the CBLOCKs 750 and 751 will be needed to provide inputs for circuits 701 and 702, freeing up a number of CBLOCK MUXs. Further, with the signal from bit 706 high, pass gate 741 will provide the select signal to MUX 726 and pass gate 742 will be disabled so that the output of MUX 626 is in a high impedance state. Further, the select input of MUX 725 will be connected to the output of MUX 751₁ bypass gate 721 and pass gate 722 will disconnect the select input of MUX 725 from ground. Finally, the output of MUX 752 will be disconnected from the input to circuit 702 by pass gate 723.

As with the circuit of FIG. 6, also note that alternatively, separate bits may be utilized to control the gates of one of more of the pass gates 731–734, 721–723 and 741–742. In this manner, one or more of the inputs of circuits 701 and 702 can be connected together by pass gates 731–734, and one or more of the 3 input LUTs may be tied together to form a larger LUT as a user desires.

Although the invention has been described above with particularity, this was merely to teach one of ordinary skill in the art how to make and use the invention. Many modifications will fall within the scope of the invention, as that scope is defined by the claims which follow.

What is claimed is:

1. An integrated circuit comprising:

a first look up table having inputs; a second look up table having inputs;

first configuration multiplexers, each having an output coupled to one of the inputs of the first look up table;

second configuration multiplexers, each having an output coupled to one of the inputs of the second look up table;

pass gates, each pass gate having a source to drain path coupling one of the inputs of the first look up table which is coupled from one of the first configuration multiplexers to one of the inputs of the second look up table which is coupled from one of the second configuration multiplexers.

2. The integrated circuit of claim 1, wherein the second configuration multiplexers each have a select input controlled so that when one of the pass gates is enabled to provide a current path from its output to one of the first look up table inputs, its output can be disabled.

3. The integrated circuit of claim 1 further comprising:

a second pass gate having a source to drain path coupling one of the outputs of the second configuration multiplexers to one of the inputs of the second look up table, the second pass gate having a gate controlled to be disabled when one of the pass gates is enabled to provide a current path from it to one of the first look up table inputs.

4. The integrated circuit of claim 1 further comprising:

a first output control multiplexer having a first data input coupled to the output of the first look up table, a second data input coupled to the output of the second look up table, a select input and an output providing an output of the CLB;

a third pass gate having a source to drain path coupling a given one of the outputs of the second configuration multiplexers to the select input of the output control multiplexer;

a fourth pass gate having a source to drain path coupling the select input of the output control multiplexer to ground, the fourth pass gate having a gate connected to receive an enabling signal when the third pass gate is enabled; and a fifth pass gate having a source to drain path coupling the given one of the outputs of the second configuration multiplexers to an input of the second look up table, the fifth pass gate having a gate controlled to receive an enabling signal when the third pass gate is disabled.

5. The integrated circuit of claim 4 further comprising:

a second output control multiplexer having an output, a first data input coupled to the output of the first look up table, a second data input connected to a high impedance, and a select input connected to receive a signal causing the first data input to be provided to its output when the select input of the first output control multiplexer is connected to ground.

6. The integrated circuit of claim 5 further comprising:

a sixth pass gate having a source to drain path coupling the select input of the second output control multiplexer to ground, the sixth pass gate having a gate coupled to the memory cell to be enabled when the memory cell is in the second state and disabled when the memory cell is in the first state; and a seventh pass gate having a source to drain path coupling the select input of the second output control multiplexer to a power supply, the seventh pass gate having a gate coupled to the memory cell to be enabled when the memory cell is in the first state and disabled when the memory cell is in the second state.

7. The integrated circuit of claim 1 further comprising:

a memory cell connected to gates of the pass gates, each pass gate being enabled when the memory cell is in a first state and disabled when the memory cell is in a second state.

8. The integrated circuit of claim 7 further comprising:

an output control multiplexer having a first data input coupled to the output of the first look up table, a second data input coupled to the output of the second look up table, a select input and an output;

a third pass gate having a source to drain path coupling a given one of the outputs of the second configuration multiplexers to the select input of the output control multiplexer, the third pass gate having a gate coupled to the memory cell to be enabled when the memory cell is in the first state and disabled when the memory cell is in the second state;

a fourth pass gate having a source to drain path coupling the select input of the output control multiplexer to ground, the fourth pass gate having a gate coupled to the memory cell to be enabled when the memory cell is in the second state and disabled when the memory cell is in the first state; and a fifth pass gate having a source to drain path coupling the given one of the outputs of the second configuration multiplexers to an input of the second look up table, the fifth pass gate having a gate coupled to the memory cell to be enabled when the memory cell is in the second state and disabled when the memory cell is in the first state.

* * * * *